(12) United States Patent
Grillberger et al.

(10) Patent No.: US 8,920,027 B2
(45) Date of Patent: Dec. 30, 2014

(54) ASSESSING THERMAL MECHANICAL CHARACTERISTICS OF COMPLEX SEMICONDUCTOR DEVICES BY INTEGRATED HEATING SYSTEMS

(75) Inventors: Michael Grillberger, Radebeul (DE); Matthias Lehr, Dresden (DE); Frank Kuechenmeister, Dresden (DE); Steffen Koch, Bretnig-Hauswalde (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 423 days.

(21) Appl. No.: 13/187,203

(22) Filed: Jul. 20, 2011

(65) Prior Publication Data

US 2012/0051392 A1   Mar. 1, 2012

(30) Foreign Application Priority Data

Aug. 31, 2010   (DE) .................. 10 2010 040 068

(51) Int. Cl.
| | |
|---|---|
| *G01K 7/00* | (2006.01) |
| *H01L 21/66* | (2006.01) |
| *H01L 23/34* | (2006.01) |
| *H01L 23/00* | (2006.01) |

(52) U.S. Cl.
CPC ............ *H01L 22/34* (2013.01); *H01L 22/12* (2013.01); *H01L 23/345* (2013.01); *H01L 24/16* (2013.01); *H01L 2224/131* (2013.01); *H01L 2924/01019* (2013.01)
USPC ...................................................... 374/179

(58) Field of Classification Search
USPC ...................................................... 374/179
See application file for complete search history.

(56) References Cited

U.S. PATENT DOCUMENTS

| | | | | |
|---|---|---|---|---|
| 3,667,064 | A | * | 5/1972 | Thornton et al. ............. 330/289 |
| 5,457,422 | A | * | 10/1995 | Rotay ............................ 327/538 |
| 2007/0168818 | A1 | | 7/2007 | Kang et al. .................... 714/745 |
| 2007/0286255 | A1 | | 12/2007 | Toyoshima ................... 374/141 |
| 2009/0285261 | A1 | * | 11/2009 | Casey et al. .................... 374/178 |
| 2009/0295457 | A1 | * | 12/2009 | Mowry et al. ................. 327/512 |
| 2010/0109005 | A1 | | 5/2010 | Grillberger et al. ............ 257/48 |

FOREIGN PATENT DOCUMENTS

| | | | | |
|---|---|---|---|---|
| DE | 102005043270 A1 | 3/2007 | ............. H01L 23/58 |
| DE | 102008053956 A1 | 5/2010 | ............ H01L 23/544 |

OTHER PUBLICATIONS

Translation of DE 102005043270 to Baier (Mar. 15, 2007).*
Guideline 2002/95/EC from the European Parliament and the Council of Jan. 27, 2003.
Translation of Official Communication from German Patent Office for German Patent Application No. 10 2010 040 068.8 dated May 3, 2011.

* cited by examiner

*Primary Examiner* — Mirellys Jagan
(74) *Attorney, Agent, or Firm* — Amerson Law Firm, PLLC

(57) ABSTRACT

In a semiconductor device or test structure, appropriate heating elements, for instance in the form of resistive structures, are implemented so as to obtain superior area coverage, thereby enabling a precise evaluation of the thermal conditions within a complex semiconductor device. In particular, the device internal heating elements may allow the evaluation of hot spots and the response of a complex metallization system to specific temperature profiles, in particular at critical areas, such as edge regions in which mechanical stress forces are typically highest in contact regimes in which the package substrate and the metallization system are directly connected.

15 Claims, 8 Drawing Sheets

ASSESSING THERMAL MECHANICAL CHARACTERISTICS OF COMPLEX SEMICONDUCTOR DEVICES BY INTEGRATED HEATING SYSTEMS

BACKGROUND OF THE INVENTION

1. Field of the Invention

The present disclosure generally relates to the field of integrated circuits, and, more particularly, to thermal management and monitoring of thermally induced stress forces of semiconductor devices.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation, to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

The increased packing density of integrated circuits resulting from the reduced device dimensions may also be accompanied by reduced switching speeds of the individual transistors in complex logic circuitry, thereby, however, contributing to increased power consumption in MOS circuits, since the reduced switching speeds allow the operation of the transistors at higher switching frequencies, which in turn increases the power consumption of the entire device. Therefore, in sophisticated applications using densely packed integrated circuits, the heat generation may reach extremely high values due to the dynamic losses caused by the high operating frequency, in combination with a significant static power consumption of highly scaled transistor devices owing to increased leakage currents that may stem from extremely thin gate dielectrics, short channel effects and the like. Therefore, great efforts are being made in order to reduce overall power consumption by restricting the usage of high performance transistors, which usually cause higher heat generation, to performance critical signal paths in the circuit design, while using less critical devices in other circuit areas. Moreover, appropriate mechanisms may be implemented to operate certain circuit portions "on demand" and control local or global operating conditions depending on the thermal situation in the semiconductor die.

The heat generated during the operation of the internal circuit elements is typically dissipated via the substrate material and the complex metallization system including highly conductive metals and sophisticated dielectric materials, depending on the overall configuration of the semiconductor device, the package accommodating the semiconductor device and the contact regime for connecting the metallization system to the wiring system of the package. Finally, the internally generated heat has to be transferred to the package and to an external cooling system connected to the package. Thus, a wide variety of cooling systems, with complex passive architectures, such as specifically designed heat sinks and heat pipes, and also expensive active cooling devices, for instance in the form of fans, water cooling systems, Peltier elements and the like, are used. With the quest for high performance of complex semiconductor devices, the corresponding power consumption of semiconductor devices, such as microprocessors, have reached the 100 Watt range, while the shrinking technology ground rules have resulted in increased thermal density of these semiconductor devices, as more transistors are packed into a smaller die region. External heat management systems, e.g., systems which may be operated on the basis of the internal thermal state of the semiconductor device, may not permit a reliable estimation of the die internal temperature distribution due to the delayed thermal response of the package of the semiconductor device and the possibly insufficient spatial temperature resolution of device internal temperature monitoring systems. Accordingly, external cooling systems may have to be designed so as to take into consideration these restrictions and to provide sufficient operational margins with respect to heat control unless a certain risk of overheating and thus possibly damaging specific critical circuit portions may be caused.

Consequently, a plurality of test strategies have been developed in order to determine or predict the temperature distribution in complex semiconductor chips in order to reliably identify temperature critical regions. It turns out, however, that the identification of hot spots in a complex integrated circuit may be difficult on the basis of the layout of the device so that frequently appropriate temperature sensing systems may not provide a reliable mesh of temperature values, as discussed above. For this reason, frequently, specific test algorithms may be performed, for instance, by power cycling a device under consideration in order to determine the thermal stress of the device under well-defined conditions. For example, a packaged semiconductor device may be operated in a well-defined manner, i.e., by running specific routines or applications, such as booting an operating system and the like, wherein any such applications may be selected so as to simulate the real world situation of the semiconductor device when used in any technical application. The temperature data may be obtained on the basis of the device-internal temperature sensors which, as discussed above, may not reliably represent the actual temperature distribution in the device. Furthermore, the selected mode of operation of the device under test may not necessarily represent the worst case situation during actual technical applications, thereby also reducing the authenticity and thus reliability of the correspondingly obtained measurement data.

In recent developments, semiconductor chips and package substrates may increasingly be directly attached to each other, which may be accomplished by providing an appropriate contact structure above the last metallization layer of the metallization system of the semiconductor chip and providing a complementary structure on the package substrate. In this manner, a large number of electrical or thermal contacts may be established across the entire area of the semiconductor chip, thereby significantly enhancing electrical and thermal performance of the packaged semiconductor device. That is, due to the direct contact of the complementary contact structures of the chip and the package, a large number of low resistance and low capacitive electrical connections may be established compared to, for instance, wire bond techniques, wherein at the same time the entire chip area is available for providing the contacts, contrary to wire bond techniques in which the bond pads are essentially restricted to the edge of the semiconductor chip. Although this direct contact regime between the package and the semiconductor chip may provide significant advantages and thus has resulted in a growing trend to apply this contact regime, in particular in cases in which increased I/O (input/output) capabilities are required. Additional difficulties may arise, in particular when further reducing the overall dimensions of the circuit features, which may also result in a reduction of the lateral size of the contact elements, for instance provided in the form of solder bumps, metal pillars and the like.

In sophisticated semiconductor devices, the overall signal propagation delay may no longer be limited by the individual semiconductor-based circuit elements but may be restricted by the electrical performance of the complex metallization system. That is, due to the ongoing shrinkage of the critical dimensions of the transistors, thereby providing advanced semiconductor devices having field effect transistors with a gate length of 50 nm and less, the metallization systems also require reduced metal lines, which may typically result in increased current densities. For this reason, increasingly, copper, copper alloys and the like may be used in order to replace aluminum in order to take advantage of copper's superior characteristics in terms of conductivity and electromigration behavior. It is well known that copper has a higher conductivity and also suffers from less electromigration compared to aluminum, thereby enabling a reduction of the cross-sectional areas of corresponding metal lines. Upon reducing the dimensions of the metal lines, also the pitch between neighboring metal lines has to be reduced, which in turn results in an increase of the parasitic capacitance. Therefore, new dielectric materials are increasingly replacing the well-established dielectric materials, such as silicon dioxide and silicon nitride, in order to reduce the overall dielectric constant in the metallization system. The reduced dielectric constant is typically accomplished by reducing the density of the dielectric materials, for instance by providing a porous structure and the like, which in turn, however, is typically accompanied by inferior mechanical characteristics. For example, such low-k dielectric materials may be more brittle compared to, for instance, silicon dioxide, while also generally the mechanical strength is reduced for these materials. In direct contact regimes (flip-chip), as discussed above, however, the package and the semiconductor chip, i.e., the metallization system thereof, are directly connected via the contact structure so that any mechanical stress caused in the package and/or the semiconductor chip may be transferred more efficiently into the other component. It is well known that usually used package substrates may have a significantly different coefficient of thermal expansion (CET) compared to the semiconductor material. Consequently, the thermal expansion of the components may be adapted for a narrow width of temperatures only, and the temperature below or above a specified temperature range may result in a significant difference in the thermal expansion, which in turn may result in significant mechanical stress forces resulting in a certain degree of bending or bowing of the package substrate. Due to the direct mechanical coupling via the contact structures of the semiconductor chip and the package substrate, any thermally induced mechanical stress forces may be "efficiently" transferred into the metallization system, which may thus have to act as a buffer material for accommodating the different thermal expansion behaviors between the package and the semiconductor chip. Due to the very different mechanical characteristics of the sophisticated low-k dielectric materials, the resulting shear forces occurring in the metallization system may result in significant damage, such as delamination of dielectric layers, the formation of cracks and the like. This situation became even worse in most recent developments in which a lead-free contact regime is to be applied, for instance in view of legal regulations and the like. As is well known, typical lead-containing solder materials, which are frequently used in a direct contact regime in the form of solder balls, may have a certain degree of resiliency, thereby accommodating a certain amount of the difference between the different thermal expansion behaviors. On the other hand, lead-free solder materials may be significantly stiffer, thereby resulting in a direct transfer of the resulting stress forces into the sensitive metallization system. In other cases, the lateral distance between the package substrate and the metallization system, i.e., the height of the corresponding contact elements, may be reduced, for instance by providing metal pillars and the like, which are typically comprised of copper, possibly in combination with a lead-free solder material, thereby even further enhancing the resulting stiffness of the contact element, which in turn leads to even more pronounced mechanical stress forces in the metallization system. It has been recognized that, in particular, pronounced mechanical stress may be observed at the edge of the semiconductor chip, for instance caused by the solder process upon connecting the package substrate and the semiconductor chip, thereby generating a weak spot of the metallization system, which may typically not be considered as a critical area when examined in view of the thermal stress of a semiconductor chip.

For this reason, it is important to identify any weak spots of the metallization system which may be caused by mechanical stress forces, while at the same time taking into consideration the thermal stress, which significantly influences the mechanical stress in a complex metallization system due to the pronounced chip-package interaction. In conventional monitoring strategies, however, reliability tests for packaged semiconductor devices may typically be performed on the basis of test structures in which the thermal load may be used from external sources with a temperature distribution that is evenly applied across the semiconductor chip. Consequently, corresponding failure mechanisms detected on the basis of these test structures may not reliably reflect the actual situation in the packaged semiconductor device so that reliable predictions about the operational behavior of a corresponding semiconductor device are difficult to achieve on the basis of these conventional strategies.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides devices, such as semiconductor devices, test devices and methods for evaluating the thermal and mechanical characteristics of semiconductor devices, and in particular of metallization systems used therein, with a superior degree of authenticity compared to conventional strategies. To this end, appropriate structures may be implemented into actual product devices or into test structures which may enable a controlled heating of certain device areas so that temperature gradients may be established within the semiconductor chip or any desired temperature distribution may be adjusted in order to cover a wide range of operating modes of the semiconductor device. Consequently, the thermally induced mechanical interaction of the metallization system and the package of the semiconductor device may be estimated, for instance by using well-established measurement equipment and strategies, as are also used in power cycling techniques and the like, thereby creating reliable measurement data for highly complex semiconductor devices. The heating elements may, in some illustrative embodiments disclosed herein, be provided in the form of resistive structures, which may be positioned in any appropriate manner within the semiconductor die region in order to obtain the desired coverage. For example, conductive lines may be implemented in one or more device layers and may be appropriately connected, for instance in the form of arrays and the like, in order to provide a certain "density" of heating elements in a given area of the semiconductor die. For example, based on device internal or external control circuits, the current flow may be controlled in the heating elements, thereby providing the possibility of "dynamically" controlling the temperature situation within the die region. Consequently, a "static" implementation of a certain temperature profile or a dynamic temperature profile or a combination thereof may be implemented, for instance by appropriately selecting a density of heating elements across the die region and/or by implementing appropriate control mechanisms for activating specifically selected heating elements and/or controlling the magnitude of the current therein. Thus, heat energy may be "deposited" within the die region in any desired manner, thereby, for instance, emulating predicated hot spots or any temperature profile extracted from the semiconductor design, while on the other hand any other temperature profiles may be established in order to more efficiently identify any weak spots in the metallization system of the device, thereby enabling establishing a correlation between hot spot predicted by design and hot spot created by a temperature profile that may result in a premature failure of the semiconductor device. For example, hot spots may be generated at critical portions, such as the die edge, in order to more reliably predict thermally induced mechanical stress in critical areas.

One illustrative semiconductor device disclosed herein comprises a plurality of transistors positioned within a die region and formed in and above a semiconductor layer that is formed above a substrate. The semiconductor device further comprises a metallization system formed above the semiconductor layer. Furthermore, a plurality of heating elements are formed above the substrate and are provided as non-transistor structures. The semiconductor device additionally comprises one or more thermal sensing areas formed within the die region and being configured to provide an output signal that is indicative of a local temperature within the die region.

One illustrative test device disclosed herein is configured for assessing thermally induced stress of semiconductor devices. The test device comprises a semiconductor layer positioned above a substrate material and a metallization system formed above the semiconductor layer. Moreover, the test device comprises an array of heating elements formed above the substrate material and also comprises a package that is directly attached to the metallization layer. Additionally, the test device comprises a plurality of temperature sensors.

One illustrative method disclosed herein relates to determining thermally induced stress in a semiconductor device. The method comprises inducing a temperature profile in a metallization layer of a packaged semiconductor by device internal heating elements, wherein at least some of these heating elements are positioned at an edge of a die region of the semiconductor device. The method further comprises determining at least one parameter that represents a status of the metallization system.

BRIEF DESCRIPTION OF THE DRAWINGS

The disclosure may be understood by reference to the following description taken in conjunction with the accompanying drawings, in which like reference numerals identify like elements, and in which.

Figure 1A:
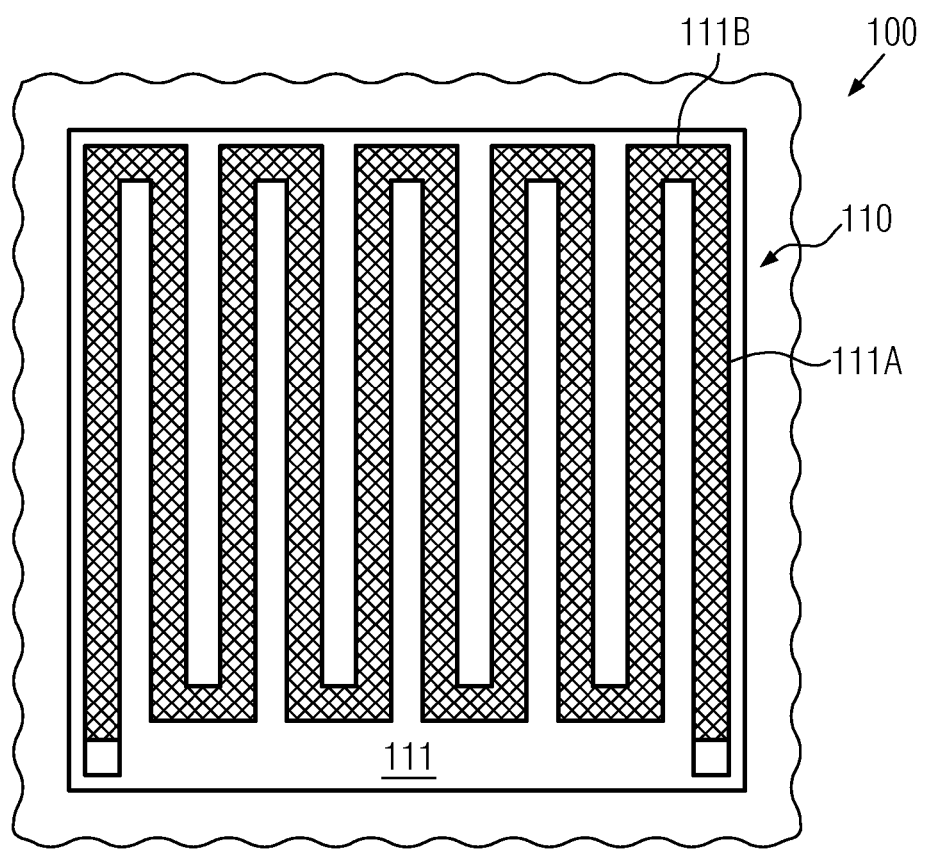
FIG. 1a schematically illustrates a top view or a layout of a resistive heater element that may be implemented in product devices or test devices, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices, for instance in the form of products and test devices, which may provide superior efficiency determining the influence of thermally induced stress forces in a packaged semiconductor device. To this end, appropriate heating elements may be implemented within one or more device areas with a desired degree of area coverage in order to establish a desired temperature profile with the device internal heating elements. Consequently, a plurality of different temperature profiles may be established across the entire die region or at least across a significant portion thereof in order to determine the behavior of critical device portions, in particular of the metallization system of the device, for a plurality of various temperature situations. For example, any hot spots may be created at device areas which may be considered critical in terms of mechanical stress forces, such as edge regions of the semiconductor die, in particular when device configurations are considered in which the semiconductor die or chip is directly connected to a package substrate on the basis of lead-free contact regimes. The device internal heating elements may be provided in combination with appropriately positioned temperature sensing elements, such as diodes, resistive structures, thermocouples and the like, thereby additionally obtaining valuable temperature information from at least critical device areas. In some illustrative embodiments, the temperature sensing areas may be established "within" the heating elements, for instance by using one or more of the heating elements as efficient temperature sensors. Furthermore, an appropriate control circuit may be provided within the semiconductor device in order to control the current flow within the heating elements, for instance by activating and deactivating specific heating elements, by generally controlling the magnitude of the current flow, for instance by applying a switched voltage to resistive heating elements and the like.

FIG. 1a schematically illustrates a top view of a portion of a semiconductor device 100 which may represent a product device, i.e., one or more integrated circuit portions formed on a corresponding die region (not shown), while in other cases the device 100 may represent a dedicated test device, which may have basically the same configuration as an actual product device, for instance in terms of overall size, a metallization formed on the device 100 (not shown) and the like, in order to obtain reliable and authentic data with respect to thermally induced stress forces created in the semiconductor device 100 upon performing appropriate test procedures. As shown, the semiconductor device 100 may comprise a heating element 110, which may be incorporated at any appropriate device level, for instance in the active semiconductor material (not shown), directly on the semiconductor layer or any isolation regions formed therein, as will be explained later on in more detail, or in one or more further device layers comprising conductive elements, such as the contact level of the semiconductor device 100 (not shown), the metallization system thereof and the like. As shown, the heating element 110 may basically represent a resistive structure including a plurality of elongated line elements 111A connected by corresponding short line elements 111B, thereby forming a serpentine-like configuration, which may thus allow obtaining a moderately high resistivity within a specific area, thereby also enabling the generation of a significant amount of waste heat upon connecting the heating element 110 to an appropriate voltage source. The conductive line elements 111B, 111A may thus comprise any appropriate material, such as a doped semiconductor material, a semiconductor/metal compound, such as a metal silicide, contact metals such as tungsten and the like, highly conductive metals, such as aluminum, copper, silver, nickel and the like, or any combinations thereof. Furthermore, the conductive lines 111A, 111B may be embedded in any appropriate dielectric material 111, such as a low-k dielectric material, a conventional dielectric material and the like, depending on the position of the heating element 110 within the semiconductor device 100.

Figure 1B:
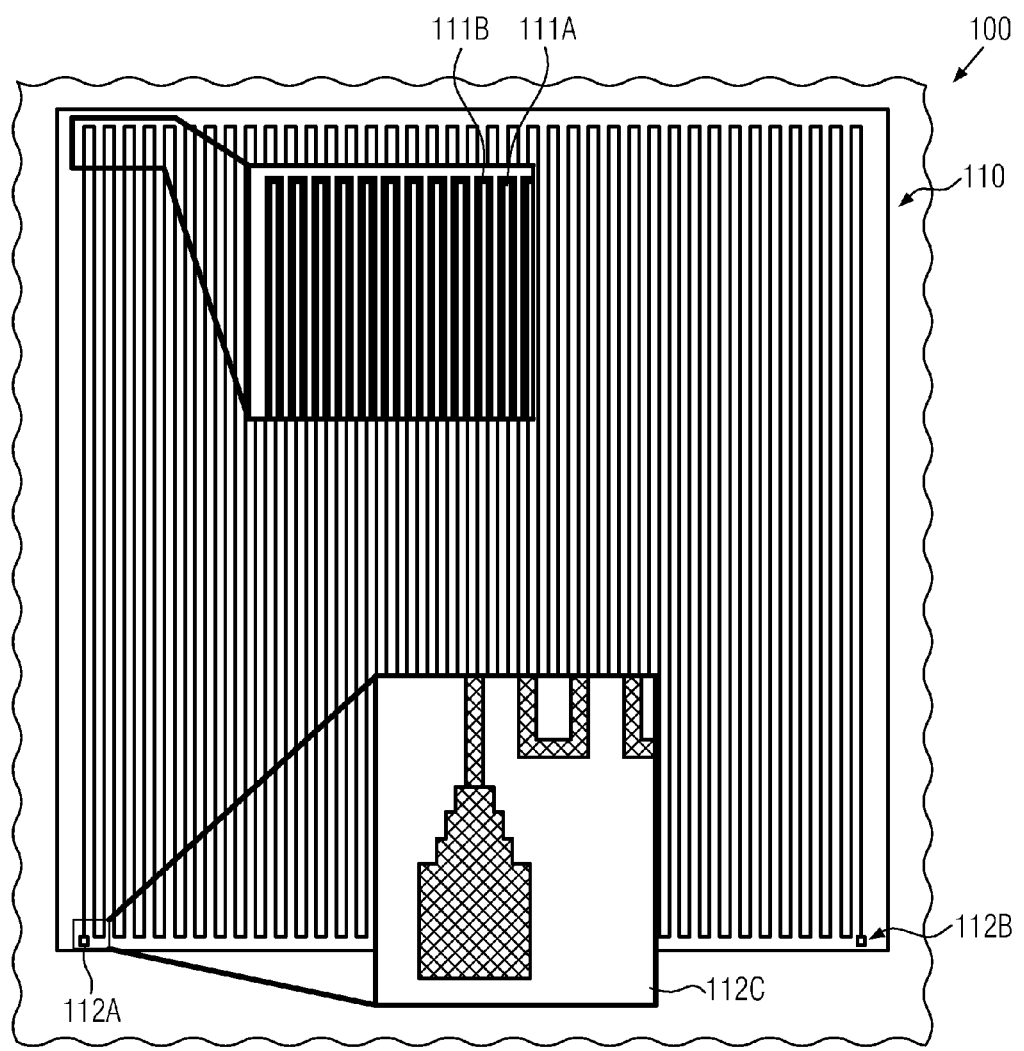
FIG. 1b schematically illustrates a top view or a layout of a further heater element comprising a moderately high density of conductive line elements and appropriate contact pads, according to illustrative embodiments.

FIG. 1b schematically illustrates a top view of the heating element 110 according to illustrative embodiments in which a moderately high area coverage may be accomplished by means of the element 110 by providing the line elements 111B, 111A with appropriately reduced lateral dimensions and with reduced spacing in order to establish a pronounced power consumption upon operating the heating element 110. For example, the element 110 may be incorporated into any of a plurality of metallization layers, wherein, for instance, the lines 111A, 111B may be provided on the basis of lateral dimensions that may correspond to the critical dimension in the metallization layer under consideration. In this manner, a "maximum" density of metal lines may be established within the heating element 110, thereby providing a high power consumption and thus heating efficiency. It should be appreciated, however, that, in other cases, the density of the line portions 111B, 111A may be selected differently in order to provide a less pronounced heat generation by the element 110, thereby also reducing the overall area consumption caused in the corresponding device layer, for instance when implementing the heating element 110 in a product device. Consequently, by providing the heating element 110 with a reduced density of actually conductive line elements may allow establishing a certain "background" heating capability, while in areas of interest in which any "hot spots" are to be generated, the heating element 110 may be provided with the "maximum" density, as is for instance shown in FIG. 1b. Moreover, the heating element 110 may comprise contact areas 112A, 112B comprising a contact pad 112C, which may be connected to a voltage supply source or which may be connected to another heating element in order to establish an array of heating elements, thereby enabling a desired degree of area coverage on the basis of individual heating elements.

Figure 1C:
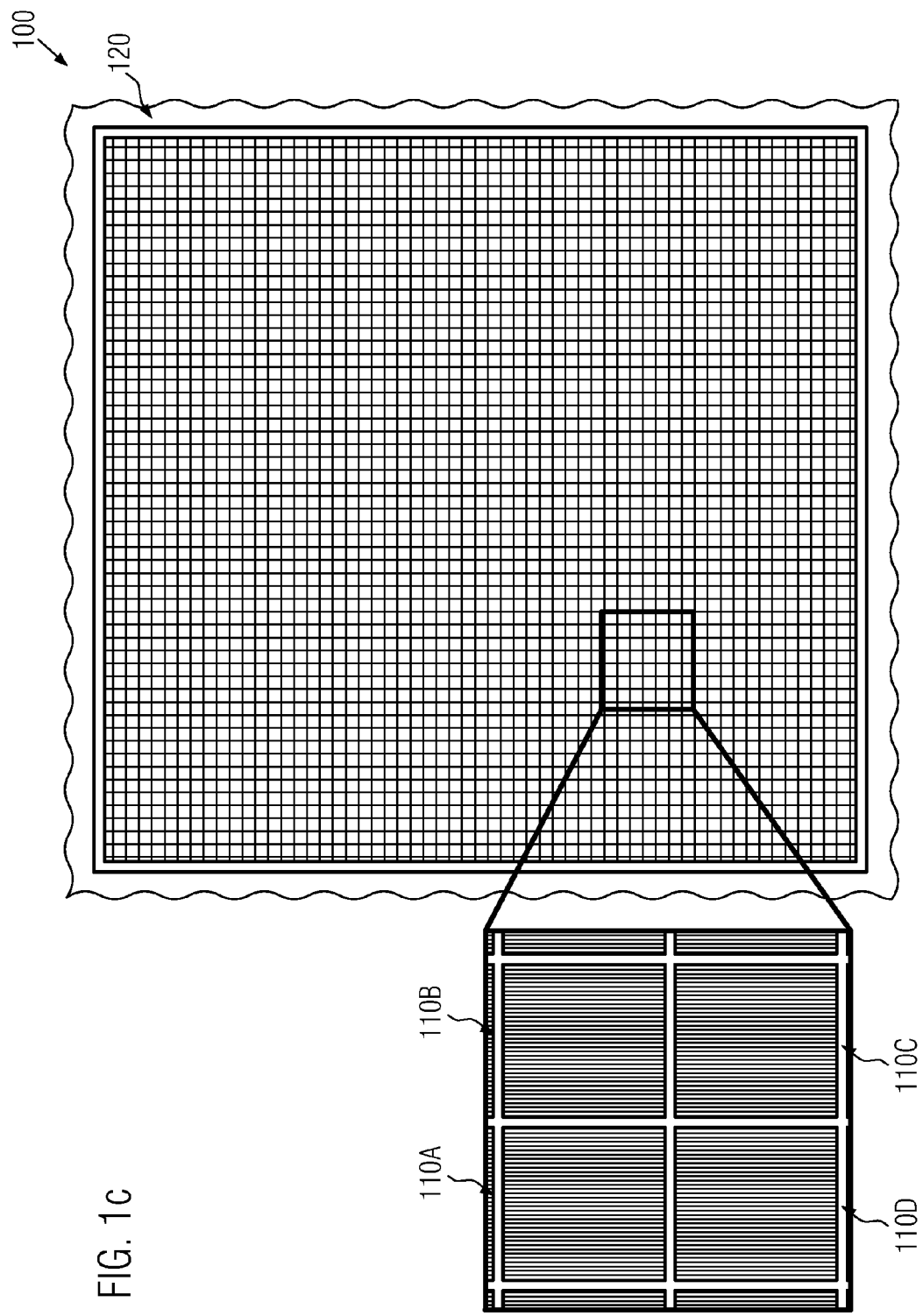
FIG. 1c schematically illustrates a top view of an array of heater elements or a layout thereof in order to provide area coverage and the capability of locally profiling the temperature profile, according to illustrative embodiments.

FIG. 1c schematically illustrates a top view of an array 120 of heating elements which may comprise a plurality of heating elements 110A, 110B, 110C, 110D, each of which may have substantially the same configuration as, for instance, illustrated in FIG. 1b. The array 120 may be appropriately connected so as to enable a profiling of the temperature distribution within the array 120, for instance by individually controlling the current flow in rows and/or columns with appropriate control circuitry or individually activating or deactivating the corresponding rows or columns. For example, the entirety of heating elements 110A, 110B, 110C, 110D may be connected in series by means of the control circuit, thereby obtaining the maximum resistance and thus the minimum current that may flow through the array 120. In other cases, the magnitude of the current in individual rows or columns may be adjusted in order to establish a different temperature profile within the array 120. In still other cases the heating elements 110A, 110B, 110C, 110D may be individually addressed within the array 120, thereby providing the capability of establishing a temperature profile with a spatial resolution that may be defined by the lateral size of an individual one of the heating elements 110A, 110B, 110C, 110D. It should be appreciated that generally the spatial resolution for establishing a desired temperature profile may be adjusted on the basis of the individual size of the heating elements 110A, 110B, 110C, 110D, the corresponding density of corresponding conductive lines provided therein and/or on the configuration of the array 120, for instance with respect to accessibility of individual heating elements and/or groups thereof, the type of heating elements provided therein, and the like.

Figure 1D:
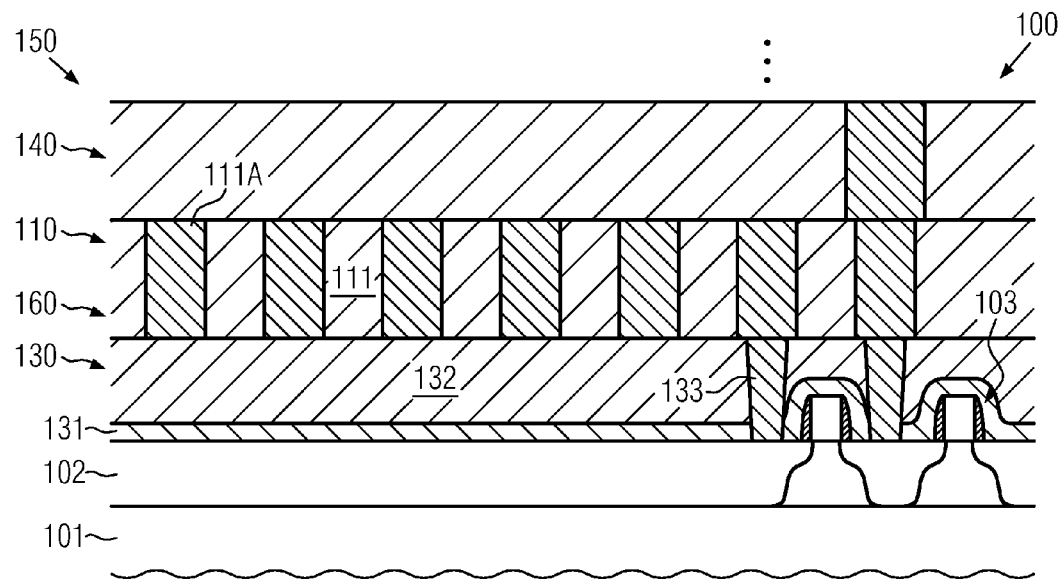
FIG. 1d schematically illustrates a cross-sectional view of the semiconductor device in which one or more heater elements may be implemented in a metallization layer of a metallization system, according to illustrative embodiments.

FIG. 1d schematically illustrates a cross-sectional view of the semiconductor device 100 which may comprise a substrate 101 and a semiconductor layer 102, such as a silicon layer, a silicon/germanium layer and the like, as is appropriate for forming therein and thereabove semiconductor-based circuit elements 103, such as transistors and the like. The substrate 101 and the semiconductor layer 102 may form a silicon-on-insulator (SOI) configuration when a buried insulating material layer (not shown) is formed directly below the semiconductor layer 102. In this case, the heat dissipation capabilities of the device 100 via the substrate 101 may be significantly less compared to bulk configurations, i.e., to semiconductor devices in which the semiconductor layer 102 may directly connect to the crystalline semiconductor material of the substrate 101. Consequently, in this case, significant heat may have to be dissipated via a metallization system 150 of the device 100, which may thus require an even more pronounced knowledge of any thermally induced stress failure mechanisms.

The semiconductor device 100 may further comprise a contact level 130, which may be considered as an interface between the circuit elements 103 formed in and above the semiconductor layer 102 and the metallization system 150. The contact level 130 may typically comprise one or more dielectric materials, such as layers 131, 132, for instance in the form of silicon dioxide, silicon nitride and the like, in which appropriate contact elements 133 may be provided, for instance comprised of tungsten and the like, which is a frequently used contact metal. In the embodiments shown, one or more of the heating elements 110 may be incorporated in the metallization system 150, for instance in the very first metallization layer 160 that connects to the contact level 130. It should be appreciated, however, that the heating element 110 may be provided in any other metallization layer of the system 150. As shown, the heating element 110 may comprise the plurality of metal line portions 111A, which are embedded in the dielectric material 111, which may thus represent the dielectric material or materials of the metallization layer 160. It should be appreciated that the heating element 110 may be positioned at any appropriate location within the semiconductor device 100, i.e., within a corresponding die region, as will be explained later on in more detail. Furthermore, in the embodiment shown in FIG. 1d, at least some of the circuit elements 103 may represent transistors which may be used as a control circuit for controlling a current flow through the heating element 110. To this end, at least one of the transistors 103 may be connectable to the supply voltage via the metallization system 150 and may also connect to the heating element 110. It should be appreciated that the one or more transistors 103 forming the control circuitry may have a sufficient current drive capability in order to establish a desired current flow through the heating element 110, thereby inducing a desired heat within the metallization system 150. In this case, the heat generated by the heating element 110 may be provided in close proximity to the semiconductor layer 102 and may be dissipated via the substrate 101 and the metallization system 150, depending on the overall device configuration, thereby obtaining similar process conditions as would be obtained upon operating other circuit elements of regular circuit portions, which may be provided at other die areas or which may be omitted if the device 100 represents a test device.

The semiconductor device 100 as shown in FIG. 1d may be formed on the basis of any appropriate process strategy. For example, the circuit elements 103 may be formed in and above the semiconductor layer 102 on the basis of any appropriate manufacturing techniques in accordance with the design rules, if actual product devices are to be formed. In other cases, the circuit elements 103 may be formed so as to comply with the current drive requirements for operating the one or more heating elements 110 if any other functional circuit portions are not implemented in the device 100. As previously discussed, in actual product devices, at least some of the circuit elements 103 may be formed on the basis of critical dimensions of 50 nm and less. Thereafter, the contact level 130 may be provided, for instance by depositing the materials 131, 132 and patterning the same in order to form openings therein, which may be subsequently filled with an appropriate conductive material. After the removal of any excess material thereof, the contact elements 133 are provided so as to connect to the circuit elements 103. Next, the dielectric material 111 may be deposited, for instance in the form of any appropriate dielectric material, which may include a low-k dielectric material or an ultra low-k (ULK) dielectric material, if sophisticated devices are considered, as discussed above. Thereafter, the dielectric material 111 may be patterned by using well-established lithography and etch techniques, thereby defining lateral size and position of any conductive elements of the heating element 110, for instance in the form as discussed above with reference to FIGS. 1a and 1b. At the same time, other metal structures may be formed which may connect to circuit elements as required by the overall circuit layout under consideration. Thereafter, the openings formed in the dielectric material 111 may be filled with any appropriate materials, such as conductive barrier materials, highly conductive metals such as copper and the like, followed by the removal of any excess material in order to provide the metal lines, such as the metal line portions 111A. Next, a further metallization layer 140 may be formed, for instance by depositing any appropriate dielectric material, such as a low-k dielectric material and the like, and patterning the same so as to appropriately connect to the underlying metallization layer 160 comprising the heating element 110.

Figure 1E:
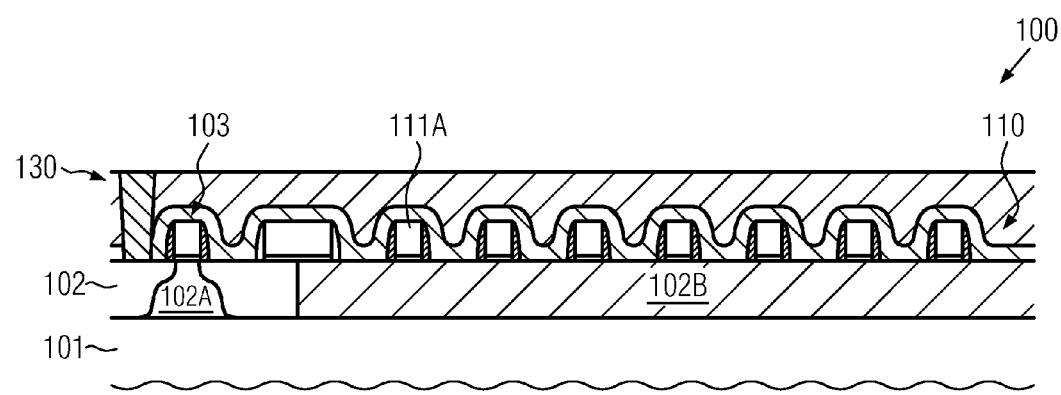
FIG. 1e schematically illustrates a cross-sectional view of the semiconductor device in which a heating element may be incorporated into an interlayer dielectric material formed above the semiconductor layer, according to illustrative embodiments.

FIG. 1e schematically illustrates the semiconductor device 100 according to further illustrative embodiments in which the heating element 110 may be provided directly above the semiconductor layer 102, for instance in the form of conductive lines having a configuration as gate electrode structures of field effect transistors of circuit elements 103. In the embodiment shown, the semiconductor layer 102 may comprise a plurality of active regions 102A, which are to be understood as semiconductor regions in and above which the circuit elements 103 may be formed. Moreover, an isolation region 102B may be provided if a superior thermal decoupling with respect to the substrate 101 is considered advantageous. That is, by providing the isolation region 102B in the form of, for instance, a silicon dioxide material, which may have a significantly reduced heat conductivity compared to silicon material, the heating element 110 may preferably contribute to heating any above-lying areas, such as a metallization system still to be formed. In other cases, conductive line portions 111A may be formed on a semiconductor region of the layer 102 if considered appropriate. Furthermore, as shown, the transistor 103 may act as a control switch, which may directly connect to the heating element 110 in order to establish a current flow therein.

The semiconductor device 100 as shown in FIG. 1e may be formed on the basis of any manufacturing technique, which may also be applied to form gate electrode structures of the transistors 103. For example, the line portions 111A may be provided in the form of a polysilicon material, a silicon/germanium material and the like, possibly in combination with a metal silicide, as is frequently used for enhancing the conductivity of gate electrode structures. In other cases, the silicidation of the line elements 111A may be suppressed by providing an appropriate mask when performing the silicidation process. Thereafter, the contact level 103 may be formed, for instance on the basis of manufacturing techniques as discussed above. It should be appreciated that, in other illustrative embodiments, the heating element 110 may be provided directly within the semiconductor layer 102, for instance in the form of serpentine-like doped areas, which may be embedded in a corresponding isolation region.

When forming the semiconductor device 100, typically, temperature sensing elements may be implemented, for instance in the form of diode elements, resistive structures and the like, and any of these well-established sensing structures may be implemented into the device 100. For example, diode structures may be incorporated into the layer 102 or in the substrate 101 upon forming the circuit elements 103. The corresponding sensing structure, contrary to conventional strategies, may be positioned within the semiconductor device 100 in correlation with the heating elements 110 so as to obtain superior information with respect to the resulting temperature profile created by the heating elements 110. In other cases, appropriate temperature sensing elements may be implemented in the metallization system of the semiconductor device 100 or within the contact level 103, as will be described later on in more detail. In other illustrative embodiments, one or more of the heating elements 110 provided in the device 100 may actually act as temperature sensing elements, which may be accomplished by appropriately connecting the respective element to a control circuitry, which may receive appropriate electrical signals or which may establish a current flow through the corresponding element while at the same time obtaining a voltage signal.

Figure 1F:
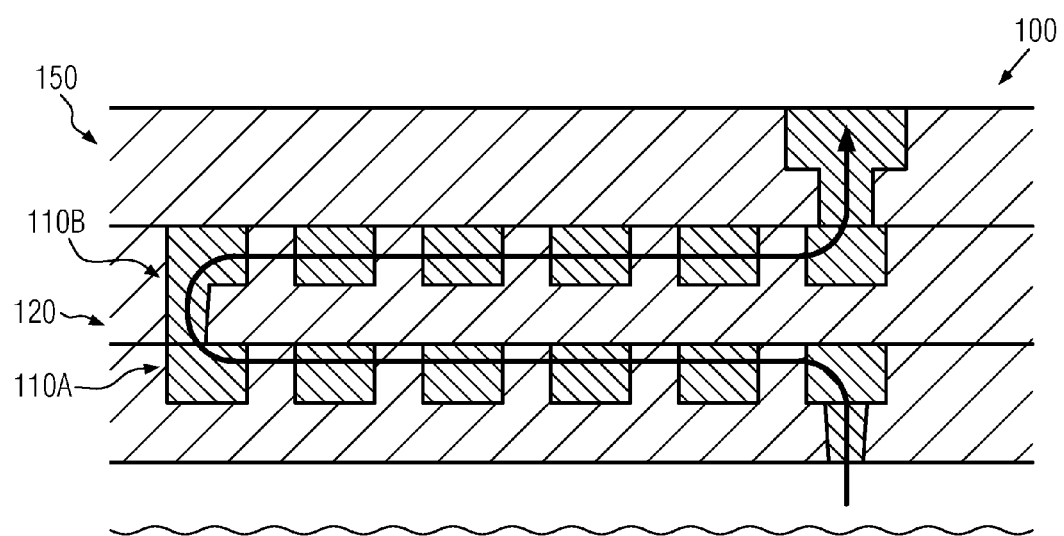
FIG. 1f schematically illustrates a cross-sectional view of the semiconductor device in which a plurality of heating elements or an array thereof may be formed on the basis of a stacked configuration in the metallization system, according to illustrative embodiments.

FIG. 1f schematically illustrates a cross-sectional view of the semiconductor device 100 according to further illustrative embodiments in which at least a portion of the array 120 of the heating elements, such as heating elements 110A, 110B, may be provided in the form of a stacked configuration. As shown, the heating elements 110A, 110B may be formed in two subsequent metallization layers of the system 150 and may be appropriately connected so as to create a current flow through the elements 110A, 110B. In this manner, the lateral area consumption of the array 120 may be reduced, while at the same time the heat generation within the metallization system 150 may be initiated in a more localized manner. It should be appreciated that the configuration of the corresponding metal line portions of the elements 110A, 110B may differ in each of the metallization layers, if considered appropriate. Moreover, the elements 110A, 110B may not necessarily be provided in adjacent metallization layers but may be distributed across several metallization layers, wherein a further metallization layer may be positioned in between without contributing to the active heat generation.

The stacked configuration of the array 120 as shown in FIG. 1f may be formed in accordance with well-established process techniques for forming the metallization system 150.

Figure 1G:
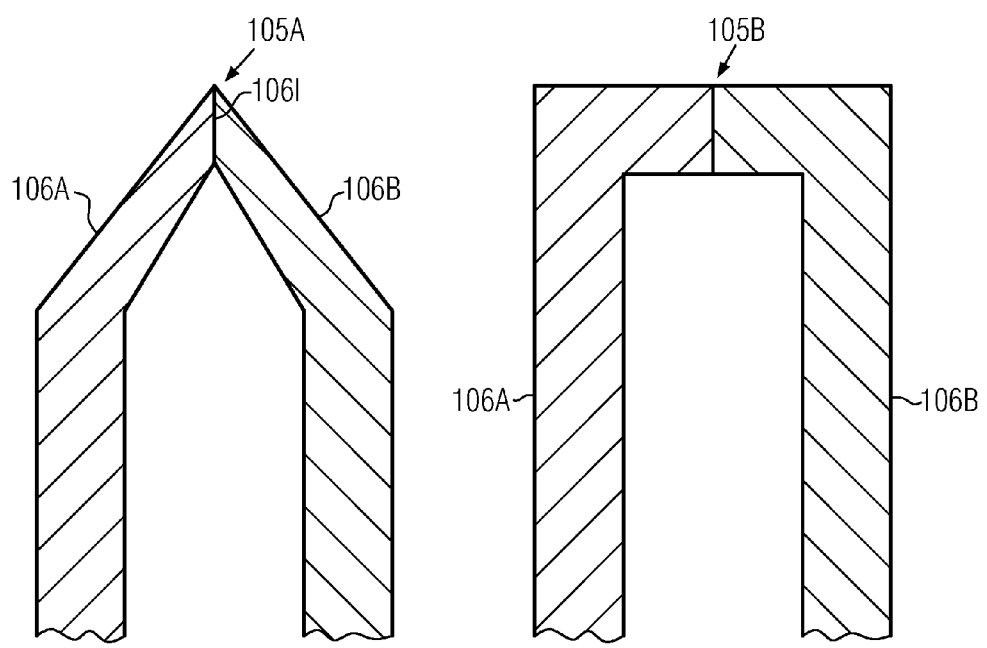
FIGS. 1g-1h schematically illustrate a top view of thermocouples that may be incorporated in any appropriate device layer, such as a metallization layer, the contact level and the like, in order to form a temperature sensing element and/or a heating/cooling element, according to still further illustrative embodiments.

FIG. 1g schematically illustrates a top view of temperature sensing elements 105A, 105B which may be provided in the form of thermocouples. To this end, the sensors 105A, 105B may comprise two different metal materials 106A, 106B, which may connect at an interface 1061. As is well known, by combining appropriate metal materials, an electrical signal may be obtained which may depend on the temperature gradient across the sensors 105A. For example, copper constantan, i.e., a copper nickel alloy, may provide an appropriate thermo-electric voltage, which may be efficiently detected and used as a temperature signal for assessing the conditions within the semiconductor device. The sensor elements 105A, 105B may be incorporated in any appropriate device level, for instance within the contact level 130 (FIG. 1d) or within one or more of the metallization layers of the metallization system 150 (FIG. 1d). Furthermore, since well-established metal materials may be used for the sensors 105A, 105B, corresponding resources are readily available in typical semiconductor facilities.

Figure 1H:
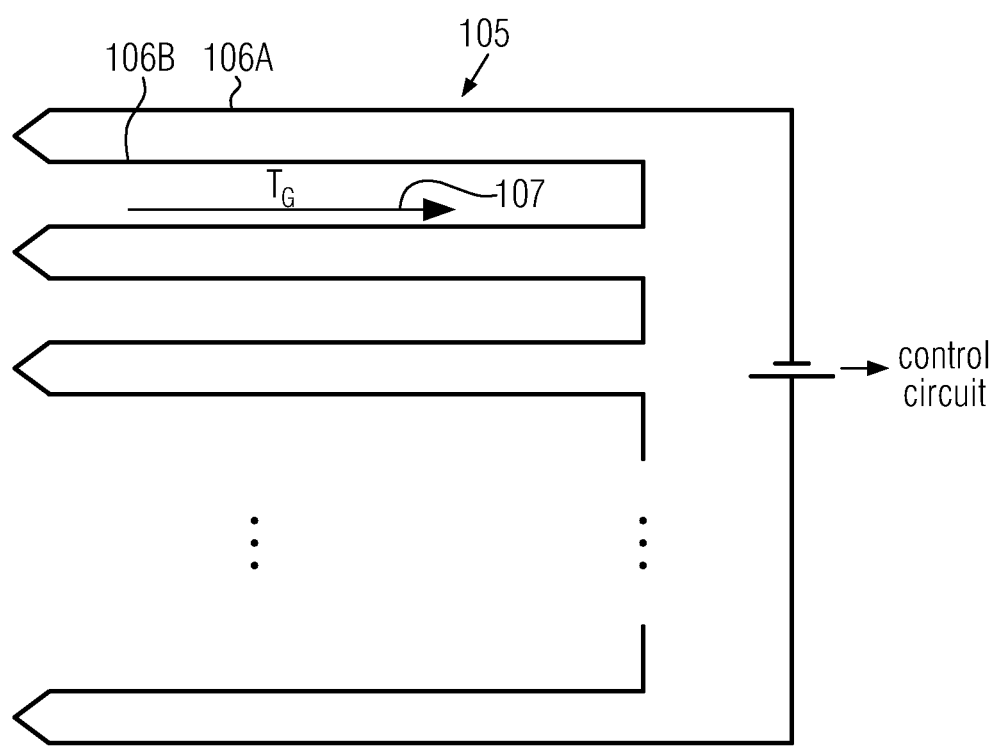

FIG. 1h schematically illustrates a top view of an array 105 of a plurality of thermocouples, for instance in the form of the thermocouples 105A, 105B as shown in FIG. 1g. In this case, the plurality of thermocouples may be electrically connected in series in order to increase the resulting temperature-induced voltage, which may be supplied to any appropriate control circuitry, while, on the other hand, the array 105 may experience substantially the same thermal conditions. For example, a temperature gradient 107 may exist across the array 105, which may be substantially the same for each of the individual thermocouples. It should be appreciated, however, that also individual thermocouples may be connected to a corresponding control circuit if the resulting temperature dependent signal is considered sufficiently high to be evaluated. Providing the temperature sensing elements in the form of thermocouples may enable appropriately positioning the first portion at any appropriate lateral position without unduly consuming valuable chip area. For example, the metal lines for the thermocouples may be efficiently formed in the contact level 130 (FIG. 1g) in which the "density" of the metal features may be significantly less compared to the density of any semiconductor-based circuit elements in the underlying semiconductor layer. Moreover, the routing of the conductive lines of a thermocouple may be established with superior flexibility, thereby allowing an efficient temperature monitoring even at lateral positions in which generally high density of circuit elements may be encountered in and above the semiconductor layer. In other cases, the thermocouples may also be implemented in one or more metallization layers of a metallization system.

In some illustrative embodiments, the array 105 may be used as a heating element by injecting an appropriate current, thereby enabling establishing a temperature gradient, for instance by conveying heat, thereby cooling down one device area while heating another device area.

Figure 1I:
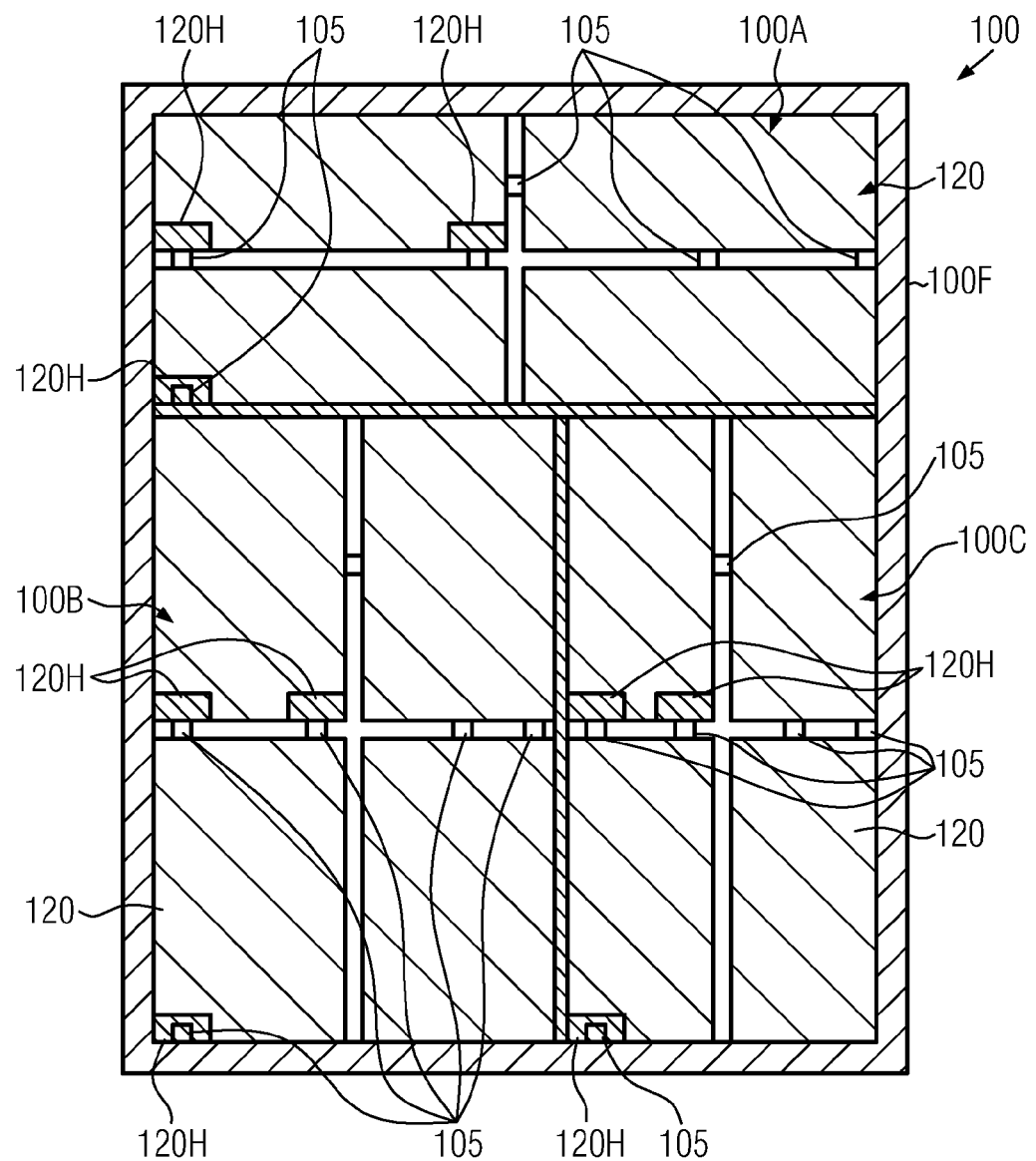
FIG. 1i schematically illustrates a top view of the semiconductor device in the form of a product device or a test device having incorporated therein a plurality of heating elements with a different "density" in order to create hot spots at critical die areas, wherein also appropriately positioned temperature sensing elements may be provided, according to illustrative embodiments.

FIG. 1i schematically illustrates a top view of the semiconductor device 100 which may be provided in the form of a semiconductor chip or die. That is, the device 100 may comprise the die region in the form of a frame region 100F, which may thus laterally delimit the actual die region that is usable for providing circuit elements and metal features. In the example shown, the internal die region may be divided into sub-areas 100A, 100B and 100C, for instance representing corresponding functional circuit portions or chiplets of the device 100. It should be appreciated, however, that any other separation may be accomplished within the frame region 100F, depending on the overall device requirements. In the embodiment shown, each of the sub-regions 100A, 100B, 100C may comprise a plurality of arrays 120 of heating elements which may be distributed across the corresponding sub-area in order to provide a certain degree of "background" coverage and thus heat generation wherein, for instance, the density of the corresponding metal line portions may be less, as is discussed above. It should be appreciated that the degree of area coverage may be different in the various sub-regions while also the density of the corresponding arrays 120 may differ in the sub-regions, depending on the overall requirements. Moreover, in each of the sub-regions or chiplets 100A, 100B, 100C, a plurality of arrays 120H of increased density may be provided in order to create a hot spot upon operating the arrays 120. For example, three "hot spot" arrays 120H may be provided, for instance, in the center of each of the sub-regions, at an edge thereof and also at a corner of the corresponding sub-regions. In this case, the most critical device regions with respect to thermal stress may be covered by one of the hot spot arrays 120H. Furthermore, in the embodiment shown, a plurality of temperature sensors 105 may be provided, for instance in the form of diodes, resistive structures, thermocouples and the like, as is also discussed above. In the embodiment shown, six areas including one or more temperature sensitive elements 105 may be provided so as to obtain a certain degree of coverage, wherein, in particular, corresponding temperature sensing elements 105 may be positioned in close proximity or within the areas corresponding to the hot spot arrays 120H.

It should be appreciated, however, that any other spatial distribution of the hot spot arrays 120H and the temperature sensing elements 105 may be used, depending on the specific device configuration. For example, as discussed above, the heating arrays 120 including the hot spot arrays 120H and the temperature sensing elements 105 may be implemented in actual product devices so that restricting any densely packed hot spot arrays to critical portions may reduce the consumption of die area. In other cases, a more pronounced coverage may be established, for instance, if dedicated test structures are considered.

Figure 1J:
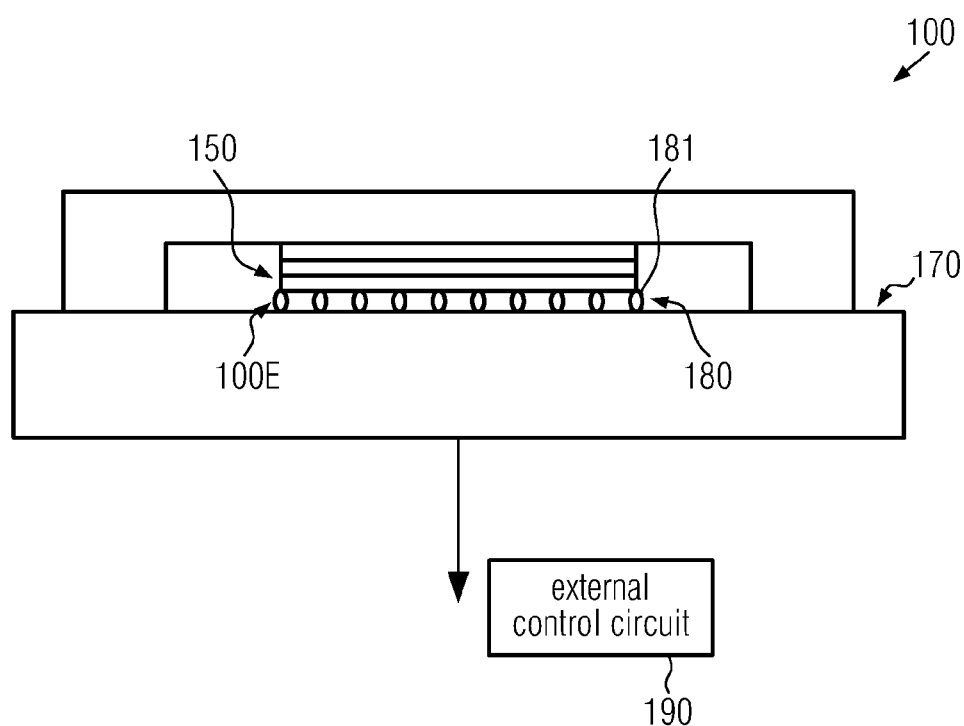
FIG. 1j schematically illustrates a cross-sectional view of the semiconductor device in a packaged state, for instance connected to an external control circuit for obtaining measurement data and/or for providing control signals to the semiconductor device, according to still further illustrative embodiments.

FIG. 1j schematically illustrates a cross-sectional view of the device 100 in a packaged state. As illustrated, a package substrate 170 may be directly connected to the metallization system 150 of the device 100 by means of an appropriate contact structure 180. To this end, the package substrate 170 may comprise an appropriate complementary structure (not shown) which may connect to corresponding solder balls, metal pillars and the like provided above the metallization system 150, thereby forming the contact structure 180. For example, contact elements 181 in the form of solder connections and the like may be provided within the structure 180. As discussed above, in sophisticated applications, the contact structure 180 may be provided in the form of a lead-free contact structure in order to avoid the usage of lead-containing solder materials. In this case, the thermally induced interaction between the metallization system 150 and the package substrate 170 may be increased due to the increased stiffness of the contact elements 181 compared to lead-containing solder connections. Consequently, by implementing the device internal heating elements, as described above, appropriate measurement data may be obtained from the device 100 by performing appropriate algorithms. For example, the device internal heating elements may be activated in order to establish a desired temperature profile, which may be accomplished upon a corresponding control signal supplied by an external control circuit 190, or which may be initiated on the basis of a device internal self test procedure, which may be activated by the control circuit 190. Consequently, appropriate measurement data may be obtained, for instance, when determining the change in resistance of any of the contact elements 181 by means of the control circuit 190 and the like, which may also indicate the status of the metallization system 150. In other cases, the device 100 may be cycled through a predefined number of heating and cooling events and subsequently the device 100 may be subjected to further analysis, for instance cross-sectional analysis and the like, in order to determine any appropriate parameter that indicates a state of the metallization system 150. For example, upon activating the device internal heating system, in particular the edge region 100E of the semiconductor die, may be evaluated with respect to thermally induced mechanical stresses.

As to the ability for establishing a desired temperature profile across at least a significant portion of the device 100 and thus across the metallization system 150, any possible operating mode can be simulated and any worst case scenarios may be monitored, thereby providing statistically relevant statements with respect to any weak spots and with respect to the reliability in particular of the metallization system 150. Moreover, by establishing different temperature profiles, the measurement data obtained by means of the control circuit 190 may be compared with corresponding simulation programs, thereby enabling a corresponding adaptation of the simulation parameters in order to more reliably predict the thermal and mechanical response of complex semiconductor devices, and in particular of complex metallization systems.

As a result, the present disclosure provides semiconductor devices, for instance in the form of product devices or test structures, in which a device internal heating system may enable the monitoring and evaluation of the thermal and mechanical stress conditions within complex semiconductor devices. For example, a desired area coverage may be obtained by providing corresponding heating elements or arrays thereof within any device layer, for instance within the metallization system, wherein the activation of the heating system may be controlled on the basis of internal or external control circuitry. Furthermore, hot spots may be efficiently "positioned" within the semiconductor die, thereby enabling a broad simulation of operating modes, which may also allow the identification of worst case scenarios with respect to the thermal behavior of the semiconductor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a plurality of transistors positioned within a die region and formed in and above a semiconductor layer that is formed above a substrate;
    a metallization system formed above said semiconductor layer;
    a plurality of heating elements formed above said substrate and provided as non-transistor structures, wherein at least one of said plurality of heating elements comprises a plurality of thermocouples, and wherein said plurality of heating elements are arranged as one or more arrays such that magnitude of current in individual rows or columns of an array is adjustable to establish different temperature profiles within the array; and
    one or more thermal sensing areas formed within said die region and being configured to provide an output signal indicative of a local temperature within said die region.

2. The semiconductor device of claim 1, further comprising a control circuit formed from some of said plurality of transistors and configured to control energy supply to said plurality of heating elements.

3. The semiconductor device of claim 1, wherein at least one of said one or more arrays of heating elements is formed above said semiconductor layer and below said metallization system.

4. The semiconductor device of claim 1, wherein at least one of said plurality of heating elements comprises a resistive structure.

5. The semiconductor device of claim 1, wherein said die region comprises a plurality of die sub-regions and wherein each of said die sub-regions comprises a subset of said plurality of heating elements.

6. The semiconductor device of claim 1, wherein one of said one or more arrays of heating elements is formed in said metallization system.

7. The semiconductor device of claim 6, wherein one of said one or more arrays of heating elements is provided as a stacked configuration formed in at least two stacked metallization layers.

8. The semiconductor device of claim 1, wherein a first subset of said plurality of heating elements is positioned at an edge of said die region.

9. The semiconductor device of claim 8, wherein a second subset and a third subset of said plurality of heating elements are positioned at a corner of said die region and a center, respectively.

10. The semiconductor device of claim 1, further comprising a package directly attached to said metallization system.

11. The semiconductor device of claim 10, wherein said package is directly attached to said metallization system by a lead-free contact structure.

12. A test device for assessing thermally induced stress of semiconductor devices, said test device comprising:
    a semiconductor layer positioned above a substrate material;
    a metallization system formed above said semiconductor layer;
    an array of heating elements formed above said substrate material, wherein the magnitude of current in individual rows or columns of the array is adjustable to establish different temperature profiles within the array;
    a package directly attached to said metallization system; and
    a plurality of temperature sensors formed above said substrate material, wherein at least one of said heating elements and said temperature sensors comprise a thermocouple.

13. The test device of claim 12, wherein said heating elements comprise a resistive structure formed in said metallization system.

14. The test device of claim 12, wherein said array of heating elements is positioned above an edge region of said substrate material.

15. The test device of claim 14, wherein said package is attached to said metallization system by a lead-free contact structure.

\* \* \* \* \*